(12) United States Patent
Ziglioli

(10) Patent No.: US 10,707,153 B2
(45) Date of Patent: Jul. 7, 2020

(54) SEMICONDUCTOR DEVICE HAVING DIE PAD

(71) Applicant: STMICROELECTRONICS S.R.L., Agrate Brianza (IT)

(72) Inventor: Federico Giovanni Ziglioli, Pozzo d'Adda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/365,529

(22) Filed: Nov. 30, 2016

(65) Prior Publication Data

US 2017/0317060 A1 Nov. 2, 2017

(30) Foreign Application Priority Data

Apr. 29, 2016 (IT) .............................. 102016044237

(51) Int. Cl.
*H01L 23/495* (2006.01)
*H01L 21/48* (2006.01)
(Continued)

(52) U.S. Cl.
CPC .... *H01L 23/49503* (2013.01); *H01L 21/4825* (2013.01); *H01L 21/4828* (2013.01);
(Continued)

(58) Field of Classification Search
CPC ........... H01L 25/0657; H01L 23/49589; H01L 21/4825; H01L 21/4828; H01L 23/49582; H01L 21/4832; H01L 23/49541; H01L 23/49503; H01L 2224/32145; H01L 2924/181; H01L 2225/06506;
(Continued)

(56) References Cited

U.S. PATENT DOCUMENTS 5,096,852 A * 3/1992 Hobson ............. H01L 23/49531
257/E23.036
5,508,556 A 4/1996 Lin
(Continued)

FOREIGN PATENT DOCUMENTS

CN 101151727 A 3/2008
CN 104091791 A 10/2014
(Continued)

OTHER PUBLICATIONS

Bindra, "Optimized, Integrated POL Converters Deliver Performance without Trade-Offs," Digi-Key Electronics, retrieved from http://www.digikey.com/en/articles/techzone/2014/feb/optimized-integrated-pol-converters-deliver-performance-with-trade-offs, Apr. 19, 2016, 5 pages.
(Continued)

*Primary Examiner* — Shouxiang Hu
(74) *Attorney, Agent, or Firm* — Seed Intellectual Property Law Group LLP

(57) ABSTRACT

A semiconductor device includes: one or more semiconductor dice, a die pad supporting the semiconductor die or dice, a package molded onto the semiconductor die or dice supported by said die pad, wherein the die pad is exposed at the surface of the package, and the exposed die pad with an etched pattern therein to form at least one electrical contact land in the die pad.

10 Claims, 5 Drawing Sheets

(51) Int. Cl.
*H01L 23/00* (2006.01)
*H01L 23/31* (2006.01)
*H01L 25/065* (2006.01)

(52) U.S. Cl.
CPC ...... *H01L 21/4832* (2013.01); *H01L 23/3107* (2013.01); *H01L 23/49541* (2013.01); *H01L 23/49575* (2013.01); *H01L 23/49582* (2013.01); *H01L 23/49589* (2013.01); *H01L 24/48* (2013.01); *H01L 24/49* (2013.01); *H01L 24/73* (2013.01); *H01L 25/0657* (2013.01); *H01L 2224/32145* (2013.01); *H01L 2224/48247* (2013.01); *H01L 2224/73265* (2013.01); *H01L 2225/06506* (2013.01); *H01L 2924/181* (2013.01)

(58) Field of Classification Search
CPC . H01L 2224/48247; H01L 2224/73265; H01L 24/48; H01L 24/49; H01L 24/73; H01L 23/3107; H01L 23/49575
USPC .......................... 257/676, 666, 723, 724, 532
See application file for complete search history.

(56) References Cited

U.S. PATENT DOCUMENTS

| | | | |
|---|---|---|---|
| 7,211,471 | B1 | 5/2007 | Foster |
| 7,489,021 | B2 | 2/2009 | Juskey et al. |
| 7,872,335 | B2 | 1/2011 | Khan et al. |
| 8,018,055 | B2 * | 9/2011 | Terui ................ H01L 23/49503 257/532 |
| 8,072,050 | B1 | 12/2011 | Karim et al. |
| 8,673,687 | B1 | 3/2014 | Liu et al. |
| 8,791,556 | B2 | 7/2014 | Do et al. |
| 9,318,422 | B2 | 4/2016 | Shih |
| 2002/0027297 | A1 * | 3/2002 | Ikenaga ................ H01L 21/561 257/784 |
| 2004/0152241 | A1 | 8/2004 | Usui et al. |
| 2006/0170081 | A1 * | 8/2006 | Gerber ................ H01L 21/4832 257/666 |
| 2007/0135055 | A1 | 6/2007 | Ho et al. |
| 2008/0290486 | A1 | 11/2008 | Chen et al. |
| 2009/0261462 | A1 | 10/2009 | Gomez |
| 2011/0175212 | A1 | 7/2011 | Huang et al. |

FOREIGN PATENT DOCUMENTS

| | | |
|---|---|---|
| JP | 2-240940 A | 9/1990 |
| JP | 2004-119731 A | 4/2004 |

OTHER PUBLICATIONS

Lu et al., "Advanced QFN Packaging with Trace Routing Design," Advanced Semiconductor Engineering, Inc, IEEE Catalog No. CFP1459B-Ar,: pp. 331-334, 2014.

Ramos et al., "The Method of Making Low-Cost Multiple-Row QFN," $32^{nd}$ IEEE/CPMT International Electronic Manufacturing Technology Symposium, 2007, 8 pages.

* cited by examiner

SEMICONDUCTOR DEVICE HAVING DIE PAD

BACKGROUND

Technical Field

The description relates to semiconductor devices.

Description of the Related Art

Embedded capacitors may be provided, e.g., in so-called organic substrate packages of semiconductor devices. For instance, capacitors may be embedded in a leadframe (LF) package, e.g., with an SMD soldering process on a flat die pad area.

Also, die pads may be used for dissipating heat and/or to provide a single input/output pad for a semiconductor die.

Despite the extensive activity in that area, a need is still felt for arrangements providing both improved package values and improved device performance.

BRIEF SUMMARY

One or more embodiments may apply, e.g., to providing embedded capacitors in leadframes and/or providing multi-functional die pads, e.g., for integrated circuits (ICs).

One or more embodiments may also relate to a corresponding method.

The claims are an integral part of the technical disclosure provided herein in respect of one or more embodiments.

One or more embodiments is directed to a semiconductor device comprising an exposed die pad that may be transformed into an array of contact pads (lands) thereby increasing the number of input/output lines of a given package without increasing the size or changing lead count.

One or more embodiments make it possible to use a same leadframe for a plurality of devices by incorporating plural functions/dice in a same leadframe without substantial changes in the Pad On Active (POA) specifications.

One or more embodiments may provide advantages over known solutions, e.g., in terms of a hybrid package leadframe and/or multiple die pad functions.

In one or more embodiments, these results may be achieved via selective etching of the die pad, e.g., by means of a pre-plated leadframe (PPF).

BRIEF DESCRIPTION OF THE SEVERAL VIEWS OF THE FIGURES

One or more embodiments will now be described, by way of example only, with reference to the annexed figures, wherein.

It will be appreciated that, for the sake of clarity of representation, the various figures may not be drawn to a same scale.

DETAILED DESCRIPTION

In the ensuing description, one or more specific details are illustrated, aimed at providing an in-depth understanding of examples of embodiments. The embodiments may be obtained by one or more of the specific details or with other methods, components, materials, and so on. In other cases, known structures, materials or operations are not illustrated or described in detail so that certain aspects of embodiment will not be obscured.

Reference to "an embodiment" or "one embodiment" in the framework of the present description is intended to indicate a particular configuration, structure, characteristic described in relation to the embodiment is compliance in at least one embodiment. Hence, phrases such as "in an embodiment" or "in one (or more) embodiments" that may be present in one or more points in the present description do not necessarily refer to one and the same embodiment. Moreover, particular conformation, structures or characteristics as exemplified in connection with any of the figures may be combined in any other quite way in one or more embodiments as possibly exemplified in other figures.

The references used herein are provided merely for convenience and hence do not define the extent of protection or the scope of the embodiments.

Techniques for creating etched leadframes may be used in manufacturing semiconductor devices such as Quad Flat No-Lead (QFN) integrated circuits.

As noted, leadframes with included passive devices are known in the art as exemplified by documents such as U.S. Pat. No. 7,489,021 B2.

Also, semiconductor packages with stacked die assemblies are known in the art as exemplified by documents such as US 2009/0261462 A1.

Additionally, Ashok Bindra: "Integrated POL (Point of Load) converters delivering performance without trade-offs" available at http://www.digikey.com/en/articles/techzone/2014/feb/optimized-integrated-pol-converters-deliver-performance-without-trade-offs discloses capacitors integrated in Quad Flat No-Lead (QFN) devices.

Figure 1:
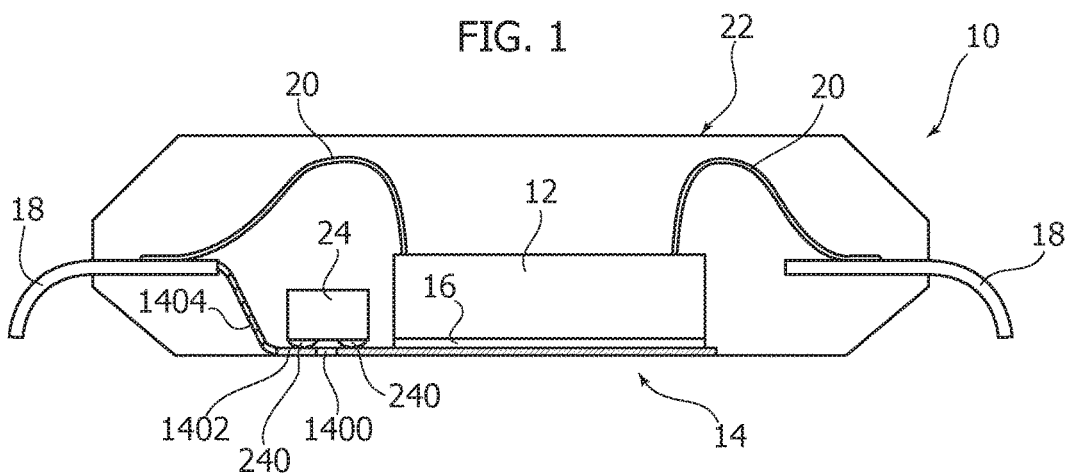
FIG. 1 is a cross-sectional view of a semiconductor device according to one or more embodiments.

FIG. 1 is exemplary of a semiconductor package or device 10 including a semiconductor die (or semiconductor device proper) 12 mounted on a die (support) pad 14, e.g., with the interposition of Die Attach Material (DAM) 16. The semiconductor die 12 includes one or more electrical components, such as integrated circuits. The integrated circuits may be analog or digital circuits implemented as active devices, passive devices, conductive layers, and dielectric layers formed within the die and electrically interconnected according to the electrical design and function of the die as is well known in the art.

Reference numeral 18 denotes the contact pins (lead fingers or tips) of a leadframe of the device which may be electrically connected to the semiconductor die 12 (more properly, to contact die pads provided thereon, e.g., at an upper surface thereof) via a wire bonding wires or network 20.

The elements discussed previously may be embedded in a (e.g., plastic) package 22 including a package material such as a so-called package molding compound (PMC) molded onto the various elements discussed by leaving the outer (distal) tips of the pins 18 extending outwardly of the package 22.

The die pad 14 may be of an "exposed" type, namely with the die pad 14 exposed from the package 22, e.g., at the bottom surface thereof.

The overall arrangement discussed in the foregoing is conventional in the art, thus will not be described in more detailed description in the interest of brevity.

Further provided in the semiconductor device 10 is at least one capacitor 24 embedded in the package 22 of the semiconductor device 10 as exemplified in FIG. 1, by resorting, e.g., to selective etching of the "exposed" die pad 14.

Figure 2:
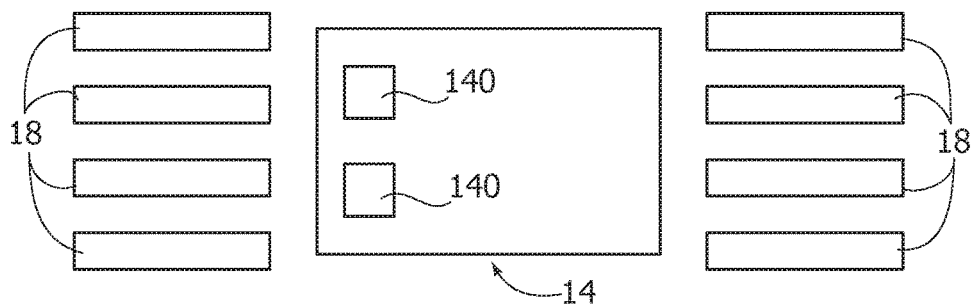
FIGS. 2 and 3 are schematic plane views (from top and bottom, respectively) of a die pad according to one or more embodiments.

FIG. 2 is a schematic top view of a leadframe that includes contact pins 18 and the die pad 14 of the device 10 of FIG. 1. The die pads show at 140 possible locations (spots) for soldering the terminals (e.g., power terminal and ground terminal) 240 of the capacitor 24.

Figure 3:
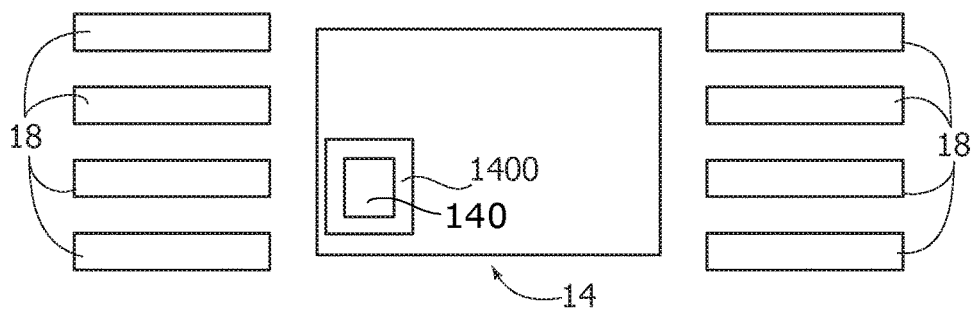

FIG. 3 is a corresponding view from a bottom of the leadframe showing the exposed metal material (e.g., copper) of the die pad 14, which is exposed at the (e.g., bottom) surface of the package 22 in FIG. 1.

Figure 4:
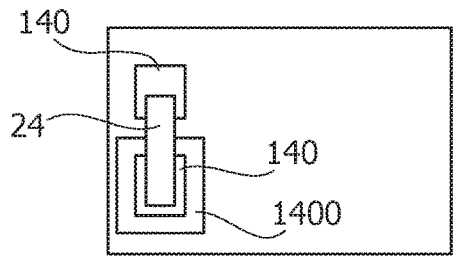
FIG. 4 is a schematic representation of a die pad according to one or more embodiments with a capacitor soldered thereon.
Figure 5:
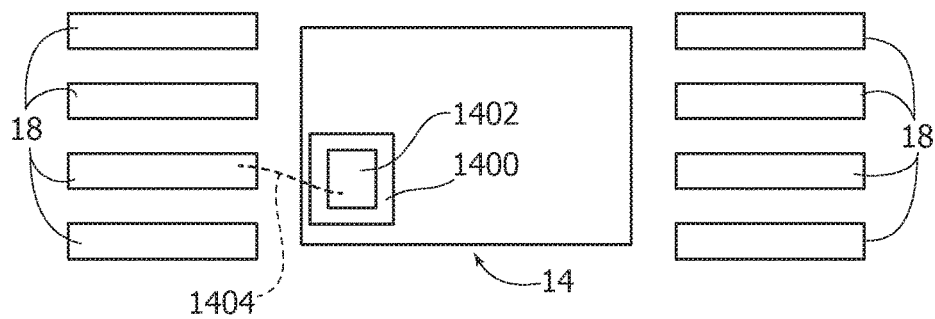
FIGS. 5 to 7 are schematic plane views from top of die pads according to one or more embodiments.

Specifically, reference 1400 denotes in FIG. 4 a portion of the die pad 14 which may be selectively etched by any known etching process, e.g., as discussed previously. For instance, the etched portion 1400 may be etched around one of the terminals 140.

As exemplified in the cross-sectional view of FIG. 1 (where the etched portion of the die pad 14 is again denoted as 1400) etching may create a "land" 1402 in the metal die pad which is separated from the rest of the die pad 14 and may thus separately connected, e.g., to any of the pins of the leadframe 18.

By way of example, in the schematic representation of FIG. 1:
  one of the terminals 240 of the capacitor 24 may be connected (e.g., soldered) to the body portion of the die pad 14,
  the other one of the terminals 240 may be connected (e.g., soldered) to the "land" 1402 formed by etching in the die pad 14, with the land 1402 further connected by a bonding wire, e.g., as shown at 1404 to one of the pins 18 of lead frame.

Figure 6:
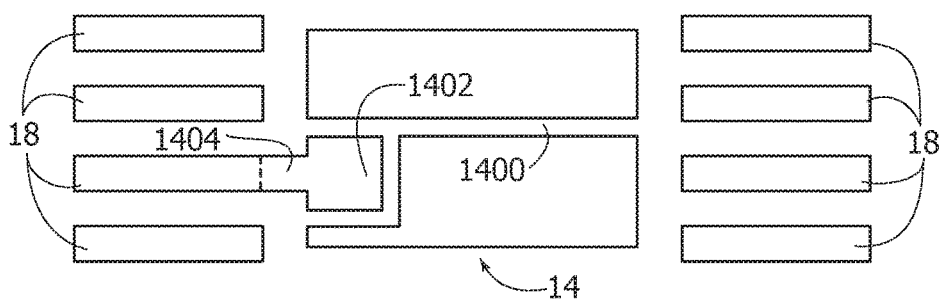
Figure 7:
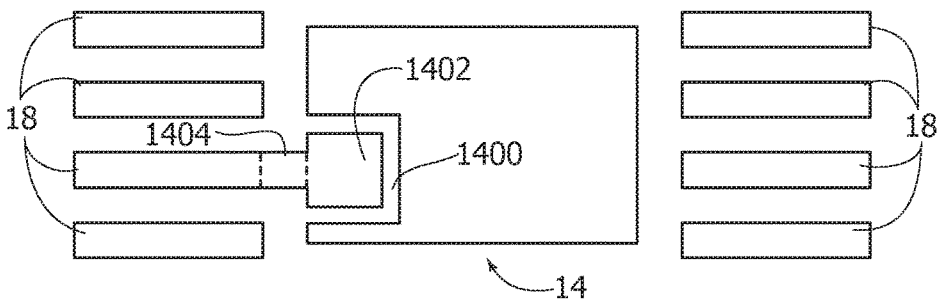

For instance, this may occur, e.g., via wiring as schematically represented in FIG. 1 or by the land 1402 being formed solid (e.g., one-integral piece) with one of the pins 18 in the leadframe 18 as schematically represented, e.g., in FIGS. 6 and 7.

An etching pattern of the die pad 14 as exemplified at 1400 may be selected within a wide variety of possible patterns thus producing a corresponding wide variety of land morphologies, including the possibility of producing plural lands 1402 etched in the die pad 14.

More generally, multiple die pad lands 1402 may be produced in order to attach, e.g., passive components or different dice without having to resort to extra tie bars/leads.

FIGS. 1 to 7 exemplify that placement of such additional components may be selected with a high degree of freedom, irrespective of the specific application.

This applies, for instance, to one or more capacitors such as the capacitor 24 exemplified in FIG. 1.

Figure 14:
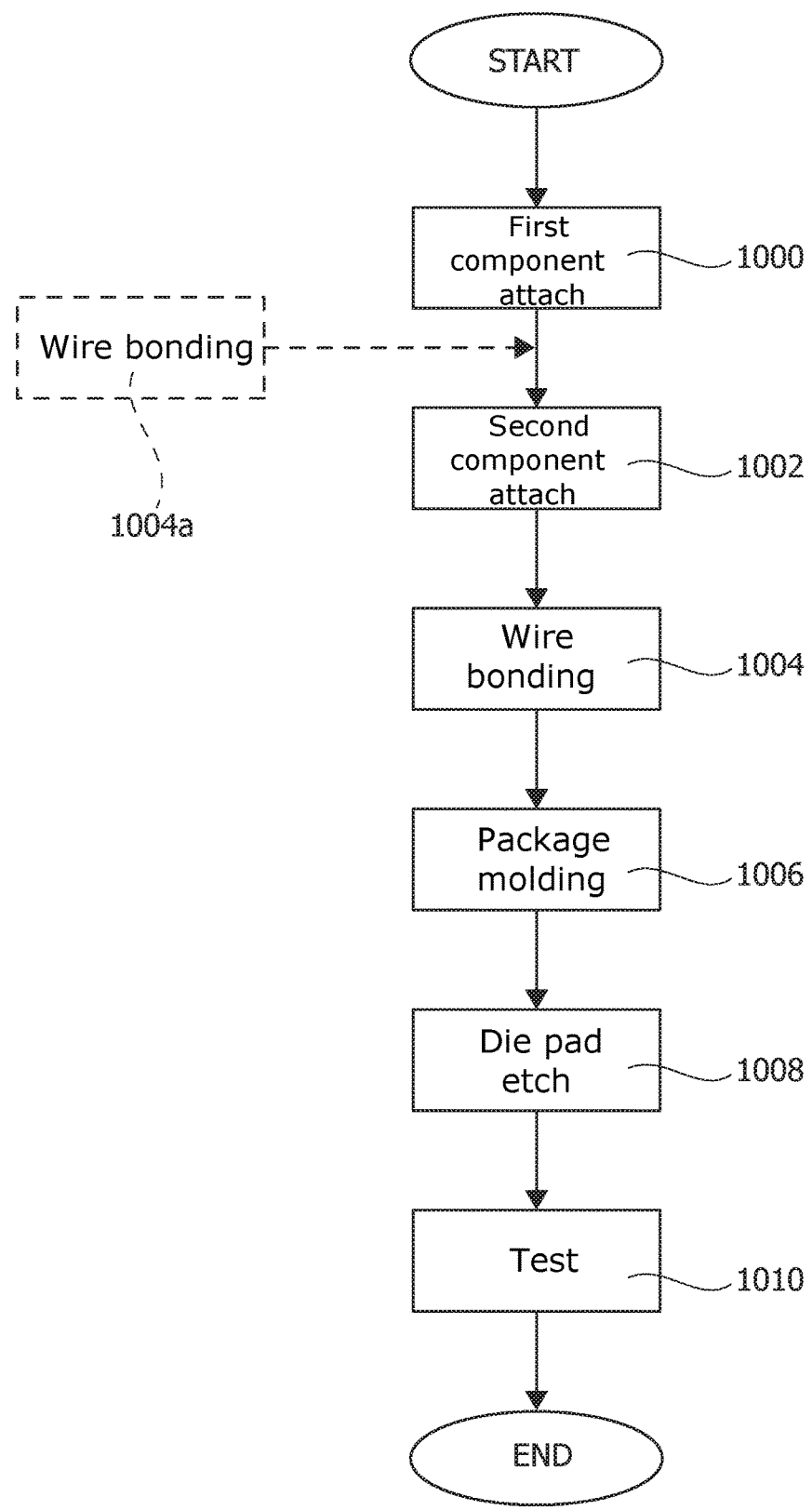
FIG. 14 is an exemplary flowchart of processes according to one or more embodiments.

In one or more embodiments, producing a semiconductor device 10 as exemplified in FIG. 1 may involve steps as exemplified in FIG. 14.

Namely, after a START step, the following steps may occur in one more embodiments:
  1000: capacitor placement and soldering (on the still un-etched die pad 14),
  1002: die attach (e.g., by the application of die attach material at 16),
  1004: wire bonding (e.g., at 20),
  1006: package molding (e.g., at 22),
  1008: die pad etching, e.g., at the exposed bottom to create lands 1402, and
  1010: testing and finishing.

It is to be appreciated that the method may occur in another order than presented, such as the 1002 die attachment may occur before or simultaneously with capacitor attachment.

FIGS. 8 to 13 are exemplary of possible developments according to one or more embodiments. In these figures, parts or elements corresponding to parts or elements already discussed in connection with FIGS. 1 to 7 have been indicated with the same reference numerals, thus making it unnecessary to repeat a detailed description.

For instance, such developments may include providing a semiconductor device 10 including a "stacked" arrangement of a first semiconductor die 121 and a second semiconductor die 122 with, e.g., the first die 121 having electrical connection pads 161 coupled to the die pad 14 and the two dice 121 and 122 mutually attached by means of an attachment material, such as tape, as exemplified at 162.

Figure 8:
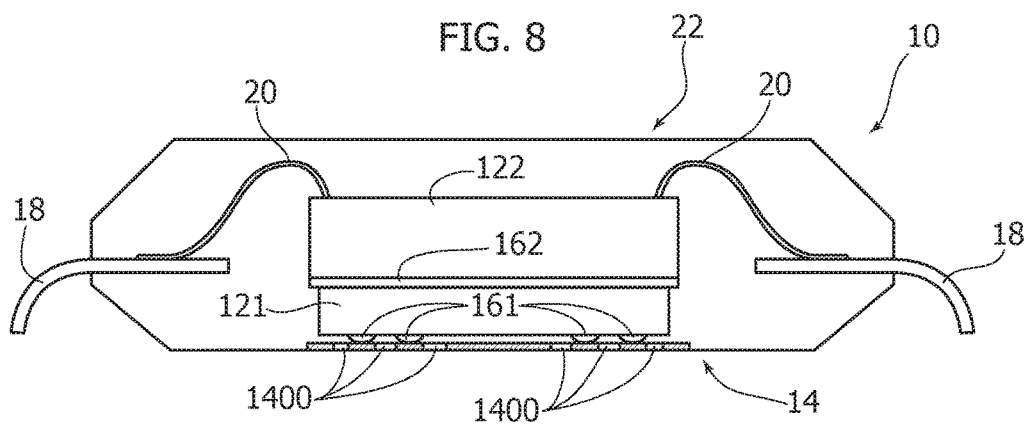
FIG. 8 is a cross sectional view of a semiconductor device according to one or more embodiments.
Figure 9:
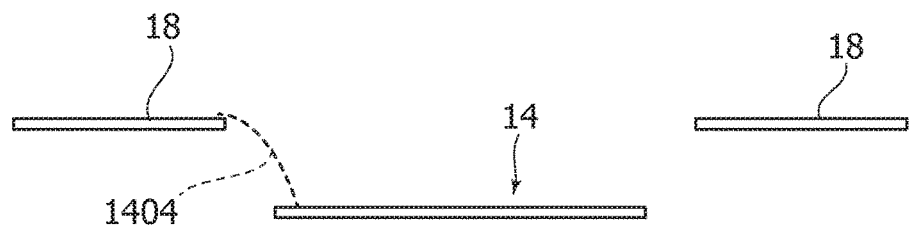
FIG. 9 is a schematic representation of leadframe leads and die pad in a device according to FIG. 8, FIGS. 10 to 12 are schematic plan views (from bottom in the case of FIGS. 10 and 12 and from top in the case of FIG. 11) of die pad/leadframe arrangement in a device according to FIG. 8.

FIG. 9 is a schematic representation of leadframe leads and the die pad 14 in a device according to FIG. 8.

Figure 10:
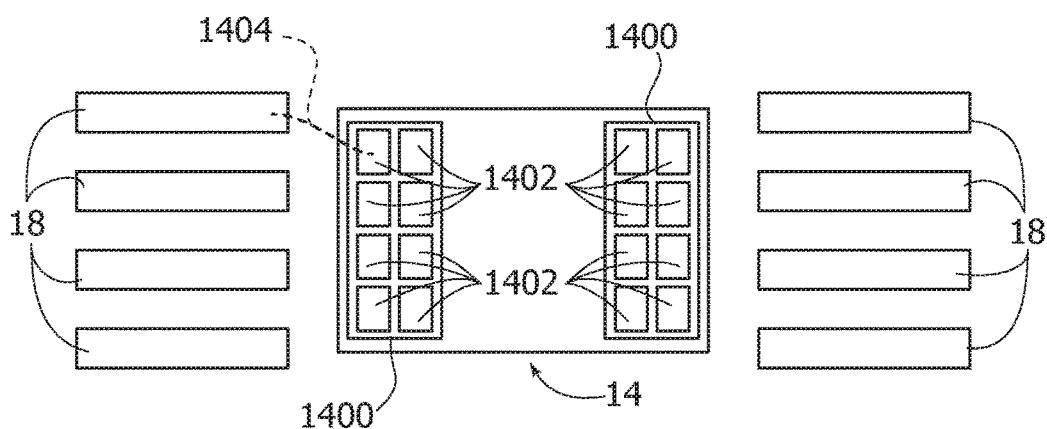

FIG. 10 is an exemplary bottom view of the die pad 14 of the leadframe indicating exposed metal (e.g., copper) areas 1400 of the die pad 14 which may be etched to create corresponding lands 1402, e.g., for electrical connection with the connection formations 161 of the first die 121, e.g., via soldering.

In one or more embodiments, the leadframe arrangement 18 may be standard, possibly with a pre-plated pattern on the bottom surface of die pad 14 to expose copper for selective etching (which again can be performed according to a standard manufacturing flow).

In one or more embodiments, the etched land or lands 1402 may be connected to the pins of the leadframe 18, e.g., by wires as schematically indicated at 1404.

Figure 11:
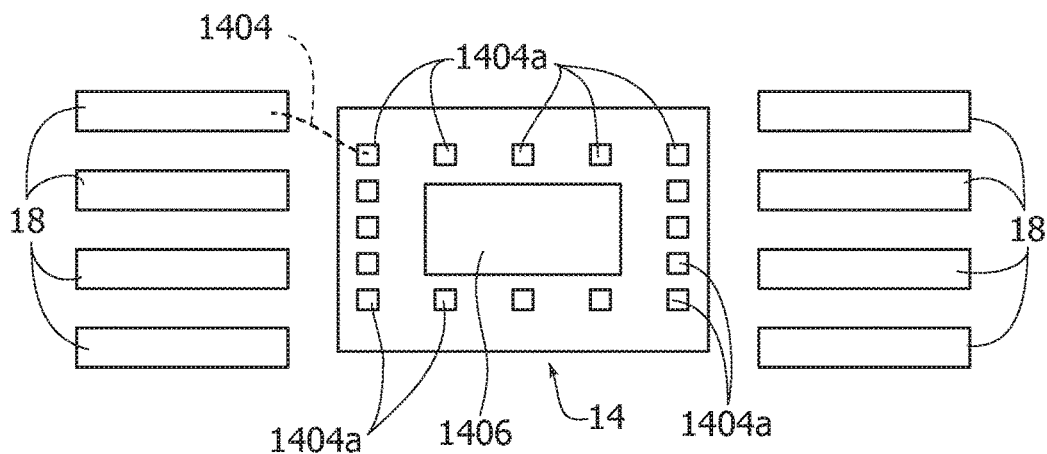

In one or more embodiments, corresponding spots (e.g., plating spots) 1404a for wire bonding as schematically exemplified in FIG. 11 may be provided.

FIG. 11 is an exemplary top plan view of the die pad 14 showing, in addition to the wire bonding spots 1404a, also a central spot 1406 for die attachment.

Figure 12:
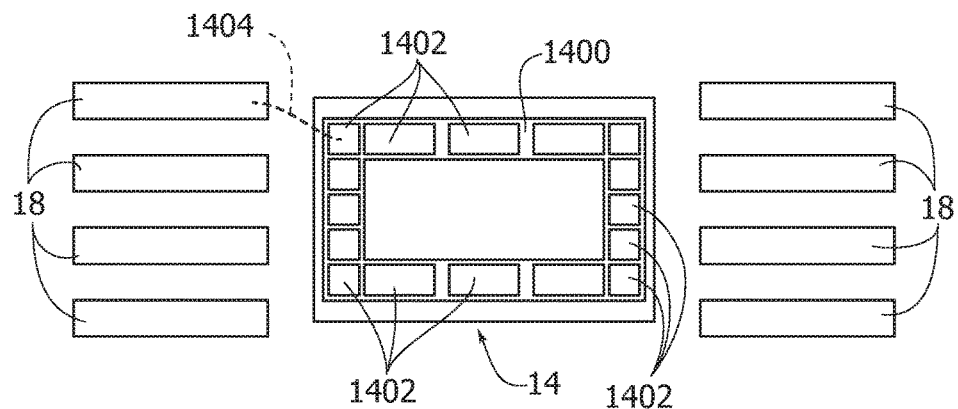

Again, etching of the metal material of the die pad 14 (as exemplified at 1400) may take place according to a wide variety of different geometries: the comparison of FIG. 10 and FIG. 12, both of these being schematically plan views from bottom of the die pad 14, bear witness to this.

Figure 13:
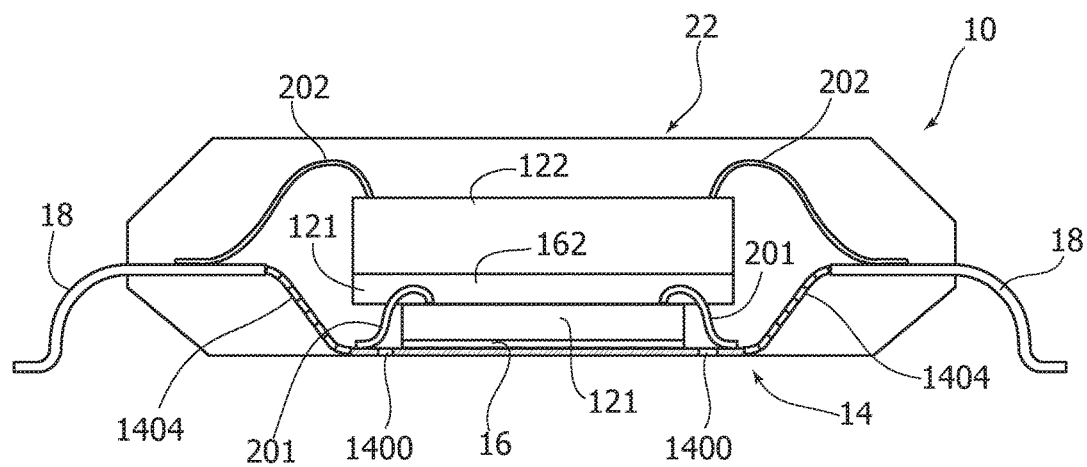
FIG. 13 is a cross sectional view of a semiconductor device according to one or more embodiments.

FIG. 13, where the same reference numerals have been used to denote part or elements already discussed in the foregoing (thus making it unnecessary to repeat a detailed corresponding description) are exemplary of the possibility of providing the first die 121 with a respective wire bonding layout (e.g., at 201) distinct from the wire bonding layout 202 for the second die 122.

One or more embodiments may thus include the first and second dice 121, 122 coupled at 162 via Flow-Over-Wire (FOW) attach technology.

This makes it In one or more embodiments, manufacturing a semiconductor device as exemplified in FIG. 8 or FIG. 13 may again include the steps 1006 (package molding), 1008 (etching the exposed die pad 14 to create contact lands) and 1010 (testing and finishing).

In one or more embodiments, when manufacturing a semiconductor device as exemplified in FIG. 8 or FIG. 13, the steps 1000 to 1004 may different from the homologous steps previously discussed in connection with manufacturing a semiconductor device as exemplified in FIG. 1.

For instance, in one or more embodiments, step 1000 to 1004 in manufacturing a semiconductor device as exemplified in FIG. 8 may include the following:
- 1000: mounting (e.g., surface mount device (SMD)—flip chip-wiring bonding—at 161) the first die 121 on the still un-etched die pad 14,
- 1002: attaching the second die 122 onto the first die 121, e.g., as exemplified by FOW attach 162, and
- 1004: providing the wire bonding 202 for the second die 122.

In one or more embodiments as exemplified in FIG. 13 the first die 121 may be attached (e.g., by the application of die attach material at 16) on the still un-etched die pad 14 at step 1000 and a separate wire bonding 201 may be provided for the first die 121. In that case, a (first) wire bonding layout 201 for the first die 121 may be provided in a (first) wire bonding step 1004a taking place after the step 1000 and before the step 1002 of attaching the second die 122 onto the first die 121, e.g., at 162.

It will be appreciated that details of embodiments as exemplified herein in connection with one of the figures may be freely transposed to embodiments as exemplified in other figures.

Just to mention one example (this being just a non-limiting example) the electrical coupling arrangement of the first die 121 with the die pad 14, e.g., via electrical connection formations 161 coupled with electrical contact lands 1402 in the die pad layer 14 is in no way linked to the presence of the second die 122 and may be applied, e.g., to a "single die" arrangement as exemplified in FIG. 1.

One or more embodiments may thus provide a semiconductor device (e.g., 10), including:
- at least one semiconductor die (e.g., 12 or 121, 122),
- an (electrically conductive, e.g., copper) die pad (e.g., 14) supporting said at least one semiconductor die,
- a package (e.g., 22) onto said at least one semiconductor die supported by said die pad, wherein said die pad is exposed at the surface of said package, and
- said exposed die pad having an etched pattern therein (e.g., 1400) with at least one electrical contact land (e.g., 1402) formed in said die pad.

One or more embodiments may include a leadframe (e.g., 18) with at least one electrical contact pin, said at least one electrical contact pin electrically coupled (e.g., via the capacitor 24 or an electrically conductive path 1404) with said at least one electrical contact land in said die pad.

One or more embodiments may include a capacitor (e.g., 24) embedded in said package, wherein said capacitor is set between said at least one electrical contact pin and said at least one electrical contact land in said die pad thereby providing electrical coupling therebetween.

In one or more embodiments, said at least one electrical contact pin may be electrically coupled (e.g., at 1404) with said at least one electrical contact land in said die pad via wiring.

One or more embodiments may include at least one electrical contact spot (e.g., 1404a) for said wiring the surface of the die pad facing inwardly of the semiconductor device.

In one or more embodiments, said at least one electrical contact pin may be electrically coupled with said at least one electrical contact land in said die pad by being formed integral therewith.

In one or more embodiments, said at least one semiconductor die may be coupled with said die pad via at least one of:
- a die attach layer (e.g., 16, 162), and/or
- at least one electrical coupling formation (e.g., 161) coupled with said at least one electrical contact land formed in said die pad.

One or more embodiments may include:
- a first semiconductor die (e.g., 121) supported by said die pad, and
- at least one second semiconductor die (e.g., 122) stacked onto said first semiconductor die.

One or more embodiments may include a leadframe (e.g., 18), with said first semiconductor die and said at least one second semiconductor die having respective wire bonding means (e.g., 201, 202) to said leadframe.

In one or more embodiments, a method of providing a semiconductor device may include:
- arranging at least one semiconductor die onto a die pad, whereby said at least one semiconductor die is supported by said die pad,
- forming a package onto said at least one semiconductor die supported by said die pad, said die pad exposed at the surface of said package, and
- etching an etched pattern into said exposed die pad thereby forming at least one electrical contact land in said die pad.

Without prejudice to the underlying principles, the details and embodiments may vary, even significantly, with respect to what has been disclosed by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, comprising:
   at least one semiconductor die,
   a plurality of leads,
   a single, continuous die pad supporting the at least one semiconductor die at a first surface, the plurality of leads being at a first side of the die pad, the die pad including a cutout at the first side,
   at least one electrical contact land that is electrically isolated and separated from the die pad and defined at least in part by the cutout at the first side of the die pad, the at least one electrical contact land being separated from the die pad by the cutout, wherein a surface of the at least one electrical contact land, a surface of the die pad, and the cutout together form a rectangular shape in a plane, wherein at least one lead of the plurality of leads and the at least one electrical contact land are formed from a single piece, a capacitor electrically and mechanically coupled to the die pad and the at least one electrical contact land, and a package around the at least one semiconductor die and the capacitor.

2. The semiconductor device of claim 1, wherein a lower surface of the die pad forms an outer surface of the semiconductor device.

3. The semiconductor device of claim 1, wherein the at least one semiconductor die is coupled to the die pad by at least one of:
   a die attach layer, and
   at least one electrical coupling formation coupled with the at least one electrical contact land.

4. The semiconductor device of claim 1, wherein the at least one semiconductor die comprises:
   a first semiconductor die supported by the die pad, and
   at least one second semiconductor die stacked onto the first semiconductor die.

5. The semiconductor device of claim 4, wherein the first semiconductor die and the at least one second semiconductor die are coupled to respective leads of the plurality of leads by wire bonds.

6. The semiconductor device of claim 1, wherein the cutout is delimited by three sides of the die pad and forms a channel that isolates the at least one electrical contact land from the rest of the die pad.

7. A semiconductor package, comprising:
a plurality of leads;
a die pad including a first portion and a second portion, the second portion being physically separated and electrically isolated from the first portion by a cutout between the first and second portions at a first edge of the die pad, wherein the first portion is single and continuous, wherein the first portion, the second portion, and the cutout form a rectangular shape, the plurality of leads being at the edge of the die pad, the first portion of the die pad being formed as a single piece with a first lead of the plurality of leads;
a semiconductor die coupled to a first surface of a second portion of the die pad;
a capacitor coupled to the die pad, wherein a first terminal of the capacitor is electrically and mechanically coupled to the first portion of the die pad, wherein a second terminal of the capacitor is electrically and mechanically coupled to the second portion of the die pad; and
packaging material around the semiconductor die, a second surface of the die pad forming an outer surface of the semiconductor package, the second surface of the die pad being opposite the first surface.

8. The semiconductor package of claim 7, comprising a bonding wire that couples a first lead of the plurality of leads to the second portion of the die pad.

9. The semiconductor package of claim 7, wherein the semiconductor die is a first semiconductor die, the semiconductor package further including a second semiconductor die stacked vertically with the first semiconductor die.

10. The semiconductor package of claim 9, wherein the second semiconductor die is coupled to a back surface of the first semiconductor die.

\* \* \* \* \*